(12) United States Patent
Steeneken et al.

(10) Patent No.: US 9,177,852 B2
(45) Date of Patent: Nov. 3, 2015

(54) INTEGRATED CIRCUITS SEPARATED BY THROUGH-WAFER TRENCH ISOLATION

(71) Applicant: NXP B.V., Eindhoven (NL)

(72) Inventors: Peter Gerard Steeneken, Valkenswaard (NL); Roel Daamen, Herkenbosch (BE); Gerard Koops, Aaist (BE); Jan Sonsky, Leuven (BE); Evelyne Gridelet, Omal (BE); Coenraad Cornelis Tak, Waaire (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/449,522

(22) Filed: Aug. 1, 2014

(65) Prior Publication Data

US 2014/0342527 A1    Nov. 20, 2014

Related U.S. Application Data

(62) Division of application No. 13/705,627, filed on Dec. 5, 2012, now Pat. No. 8,853,816.

(51) Int. Cl.
*H01L 21/70* (2006.01)
*H01L 21/762* (2006.01)
*H01L 21/8238* (2006.01)

(52) U.S. Cl.
CPC .... *H01L 21/76232* (2013.01); *H01L 21/76224* (2013.01); *H01L 21/823878* (2013.01)

(58) Field of Classification Search
CPC ......... H01L 21/70; H01L 27/01; H01L 27/12; H01L 29/00; H01L 23/62
See application file for complete search history.

(56) References Cited

U.S. PATENT DOCUMENTS

2011/0091157 A1*  4/2011  Yao et al. .................. G02B 6/13
                                                                     385/42

* cited by examiner

*Primary Examiner* — Kyoung Lee

(57) ABSTRACT

An isolated semiconductor circuit comprising: a first sub-circuit and a second sub-circuit; a backend that includes an electrically isolating connector between the first and second sub-circuits; a lateral isolating trench between the semiconductor portions of the first and second sub-circuits, wherein the lateral isolating trench extends along the width of the semiconductor portions of the first and second sub-circuits, wherein one end of the isolating trench is adjacent the backend, and wherein the isolating trench is filled with an electrically isolating material.

15 Claims, 8 Drawing Sheets

US 9,177,852 B2

INTEGRATED CIRCUITS SEPARATED BY THROUGH-WAFER TRENCH ISOLATION

CROSS-REFERENCE TO RELATED APPLICATION

This application is a divisional of copending application Ser. No. 13/705,627, filed on Dec. 5, 2012, the contents of which are incorporated by reference herein.

TECHNICAL FIELD

Various exemplary embodiments disclosed herein relate generally to the isolation of integrated power transistors.

BACKGROUND

Many products require multiple CMOS circuits or transistors that operate at different voltages. Sometimes, the voltage difference between these multiple circuits can be quite large. Accordingly, to prevent damage to electronic circuits or to prevent unsafe operation of electronic circuits, high voltage isolation may be required. Circuits manufactured using standard CMOS processing may not offer high voltage isolation, so if more than approximately 20 V of isolation is required, then special processes are or may be required that incorporate isolation using silicon on insulator (SOI) substrates, or junction and medium trench isolation. The cost per wafer area of these processes and substrates is high, the area taken by the isolation regions is large, and these processes may require long development times. For this reason they are usually not available until long after the state of the art of CMOS manufacturing has advanced. For example, this may lead to high voltage CMOS transistor circuits that are manufactured using manufacturing processes that are 5-10 years behind the current state of the art CMOS processing techniques.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to an isolated semiconductor circuit comprising: a first sub-circuit in a first semiconductor portion and a second sub-circuit in a second semiconductor portion; a backend that includes an electrical connector between the first and second sub-circuits; a lateral isolating trench between the semiconductor portions of the first and second sub-circuits, wherein the lateral isolating trench extends along the width of the semiconductor portions of the first and second sub-circuits, wherein one end of the isolating trench is adjacent the backend, and wherein the isolating trench is filled with an electrically isolating material.

Further, various exemplary embodiments relate to a method of producing an isolated semiconductor circuit on a semiconductor wafer with through trenches, comprising: producing the semiconductor circuit on the semiconductor wafer including a backend; applying an etch resistant layer on a surface of the semiconductor wafer opposite the backend; producing a trench through the semiconductor wafer to the backend; and filling the trench with a isolating material.

Further, various exemplary embodiments relate to a method of producing an isolated semiconductor circuit on a semiconductor wafer with through trenches, comprising: producing a semiconductor circuit in the semiconductor wafer; depositing a pre-metallic dielectric layer; producing a trench through the pre-metallic dielectric layer and into the semiconductor wafer; filling the trench with a dielectric material; producing the backend of the semiconductor circuit; and reducing the wafer so that the trench extends completely through the semiconductor layer.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Embodiments are presented below that may speed up and lower the cost of integrating high voltage isolation in CMOS processes, including advanced CMOS processes. Examples of applications of high voltage isolation include the integration of high voltage power transistors with low voltage circuit elements. An example of such applications is shown in FIG. 1.

Figure 1:
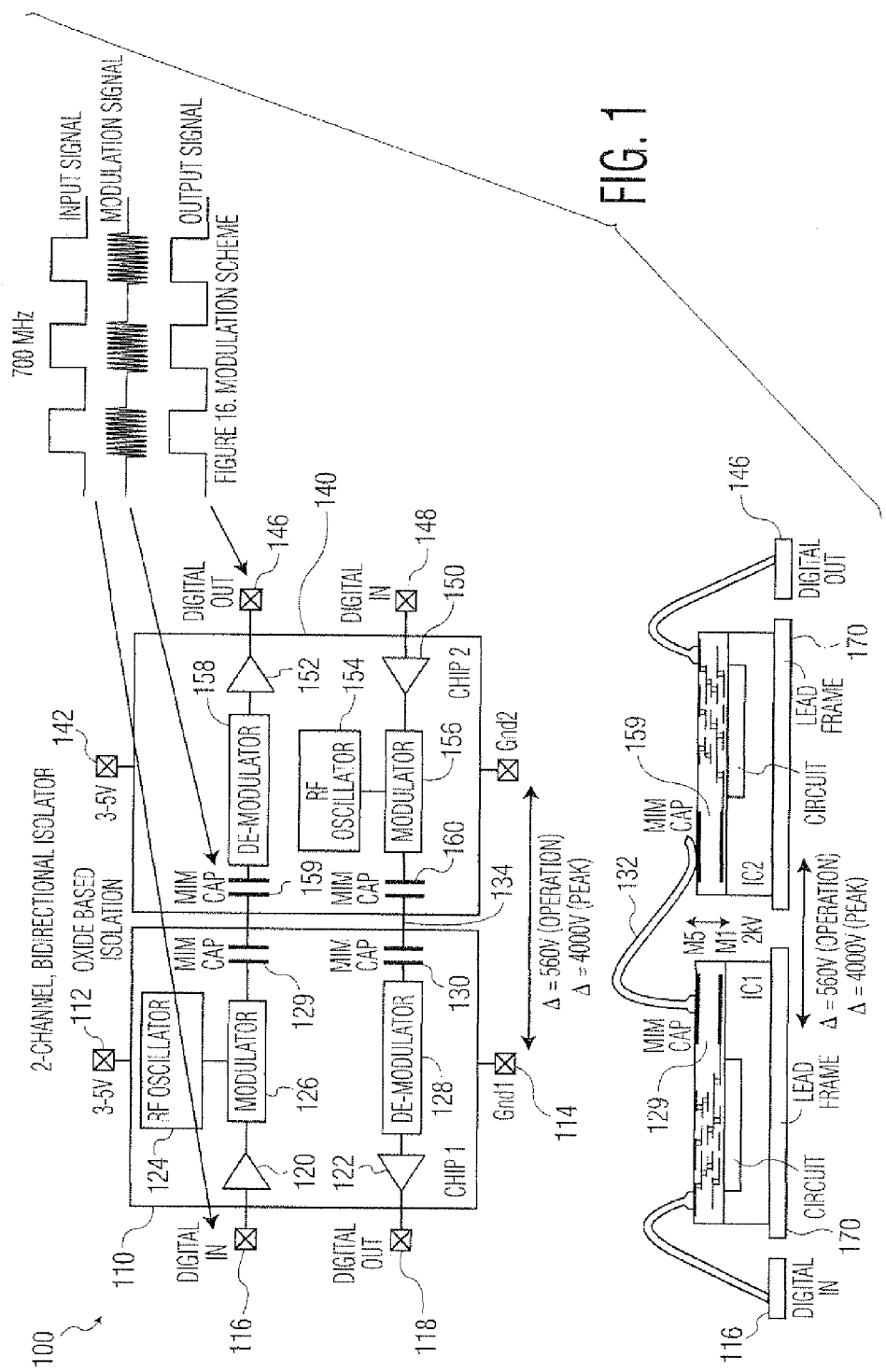
FIG. 1 illustrates a 2-channel bidirectional isolator.

FIG. 1 illustrates a 2-channel bidirectional isolator. FIG. 1 includes a plan and a cross-sectional view of the 2-channel bidirectional isolator 100. The isolator 100 is a dual die isolator. With current CMOS processing technology, this isolator cannot be integrated in a single/monolithic chip, because the ground (substrate) of both dies will be shared. Even with SOI wafers, it is not possible, because substrate voltage deviations of >200 V may cause malfunctioning transistors. Accordingly, a physical separation of the substrates provides the needed voltage isolation.

The 2-channel bidirectional isolator 100 may include a first circuit 110 on a first die and a second circuit 140 on a second die. During operation the voltage difference between the first circuit 110 and the second circuit 140 may be, for example, 560 V. The peak voltage difference may be as high as, for example, 4,000 V. The voltage differences experienced will be dependent on the specific application.

The first circuit 110 may include a power supply pad, 112, a ground 114, a digital input 116, and a digital output 118. The first circuit may further include an input buffer 120 connected to the digital input 116 and a modulator 126. The modulator 126 may receive a frequency reference from an RF oscillator 124 and may have an output connected to MIM capacitor 129 (Metal-Insulator-Metal). The MIM capacitor 129 may be attached to a connector 132 that is connected to the second circuit 140. The first circuit also may include an output buffer 122 connected to the digital output 118 and the demodulator 128. The demodulator may be connected to a MIM capacitor 130. The MIM capacitor 130 may be attached to a connector 134 that is connected to the second circuit 140.

The second circuit 140 in FIG. 1 is a 180 degree rotated version of the first circuit 110. The first circuit 110 and the second circuit 140 are connected via MIM capacitors 129, 130, 159, and 160. An input signal 134 may be modulated to a higher frequency modulated signal 136. The high frequency modulated signal. 136 is able to pass between the MIM capacitors 129 and 159 in the first circuit 110 and the second circuit 140. The high frequency modulated signal 136 may then be demodulated by the demodulator 158 to produce output signal 138. Output signal 138 may be the same as the input signal 134. This results in voltage isolation between the first circuit 110 and the second circuit 140. The drawback as mentioned above is the fact that two separate dies are needed, that may lead to increased complexity and cost. Another drawback is that the accuracy of the sizes and values of the components of the components in circuits 110 and 140 can be less well controlled. This is particularly critical for the value of connector 132. During assembly of connector 132, damage may occur on capacitors 129, 130, 159 or 160. Moreover long lengths of connector 132 will result in larger signal losses in the communication path between the circuits, which will increase power consumption. Also, variations in component values may reduce the immunity of the circuit to external disturbances. Therefore, there remains a need for a lower cost manufacturing process that may use the latest manufacturing processes, while at the same time providing for a large voltage isolation between the silicon portions. Further, the use of the separate dies may provide for digital isolation as well.

Figure 2:
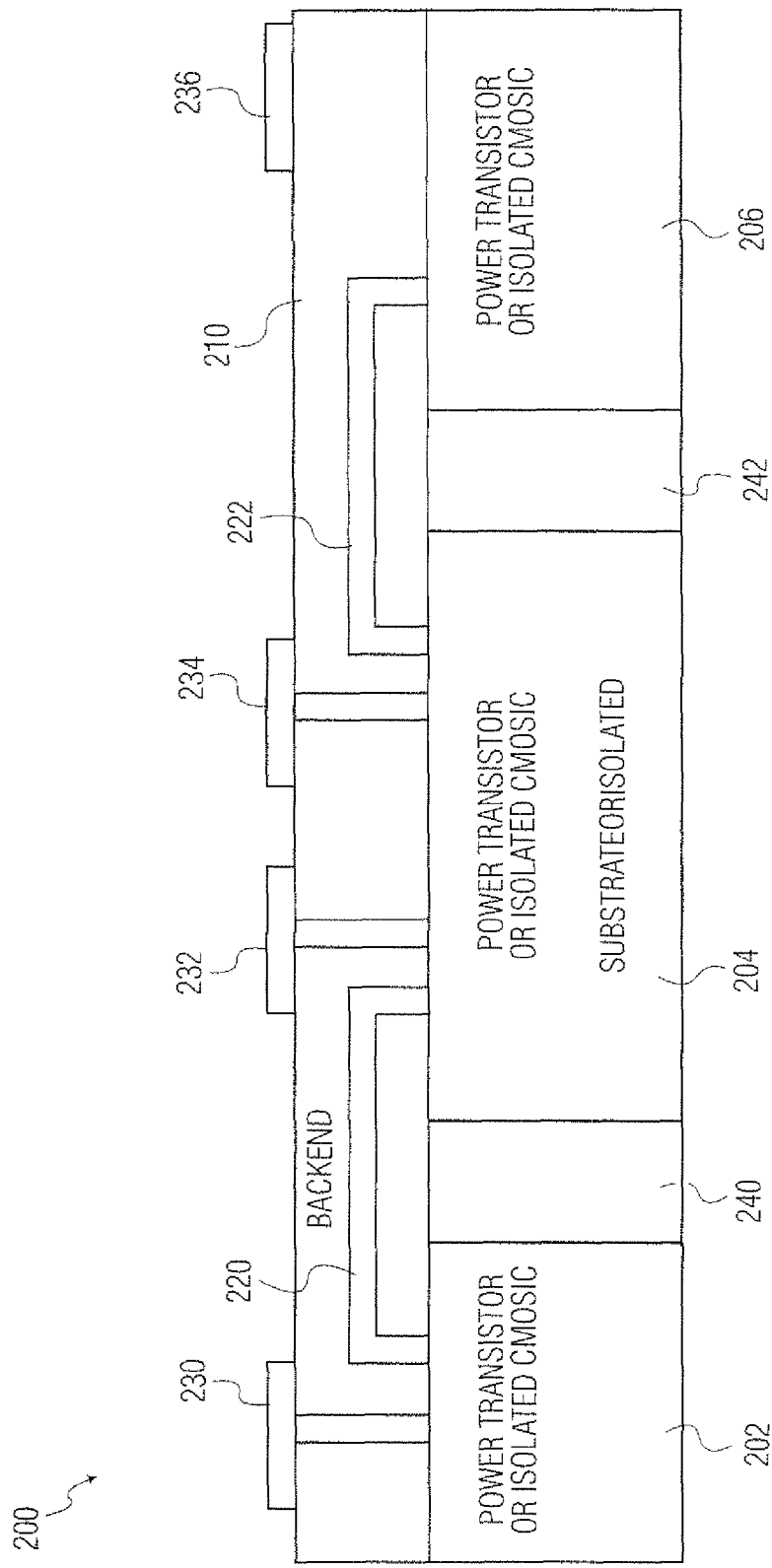
FIG. 2 illustrates a cross-sectional view of an embodiment of a voltage isolated circuit.

FIG. 2 illustrates a cross-sectional view of an embodiment of a voltage isolated circuit. The circuit 200 may include sub-circuits 202, 204, 206. The sub-circuits 202, 204, 206 may include power transistors, isolated CMOS integrated circuits (ICs), or any other sub-circuit needing isolation. The circuit 200 may also include backend 210 that may include conductive interconnect layers as well as insulating layers. The sub-circuits 202, 204, 206 may be connected to one another by interconnects 220 and 222 in the backend 210. Further, bondpads 230, 232, 234, 236 may be present to provide external connections to the backend 210 and the sub-circuits 202, 204, 206. Finally, lateral insulators 240 and 242 may prevent current from flowing between the sub-circuits 202, 204, 206 through the substrate. The lateral insulators 240, 242 may have a width and material sufficient to provide a desired voltage isolation between the sub-circuits 202, 204, 206 and will be further described below.

In FIG. 2, three sub-circuits 202, 204, 206 are described. Additional, sub-circuits may also be isolated as well. Such sub-circuits may be arranged spatially so that the voltage found at each sub-circuit is increasing. Such an arrangement will reduce the maximum voltage differences found between adjacent sub-circuits. Also, such an arrangement may be used to bridge higher voltage differences than allowed between two adjacent circuits.

Figure 3:
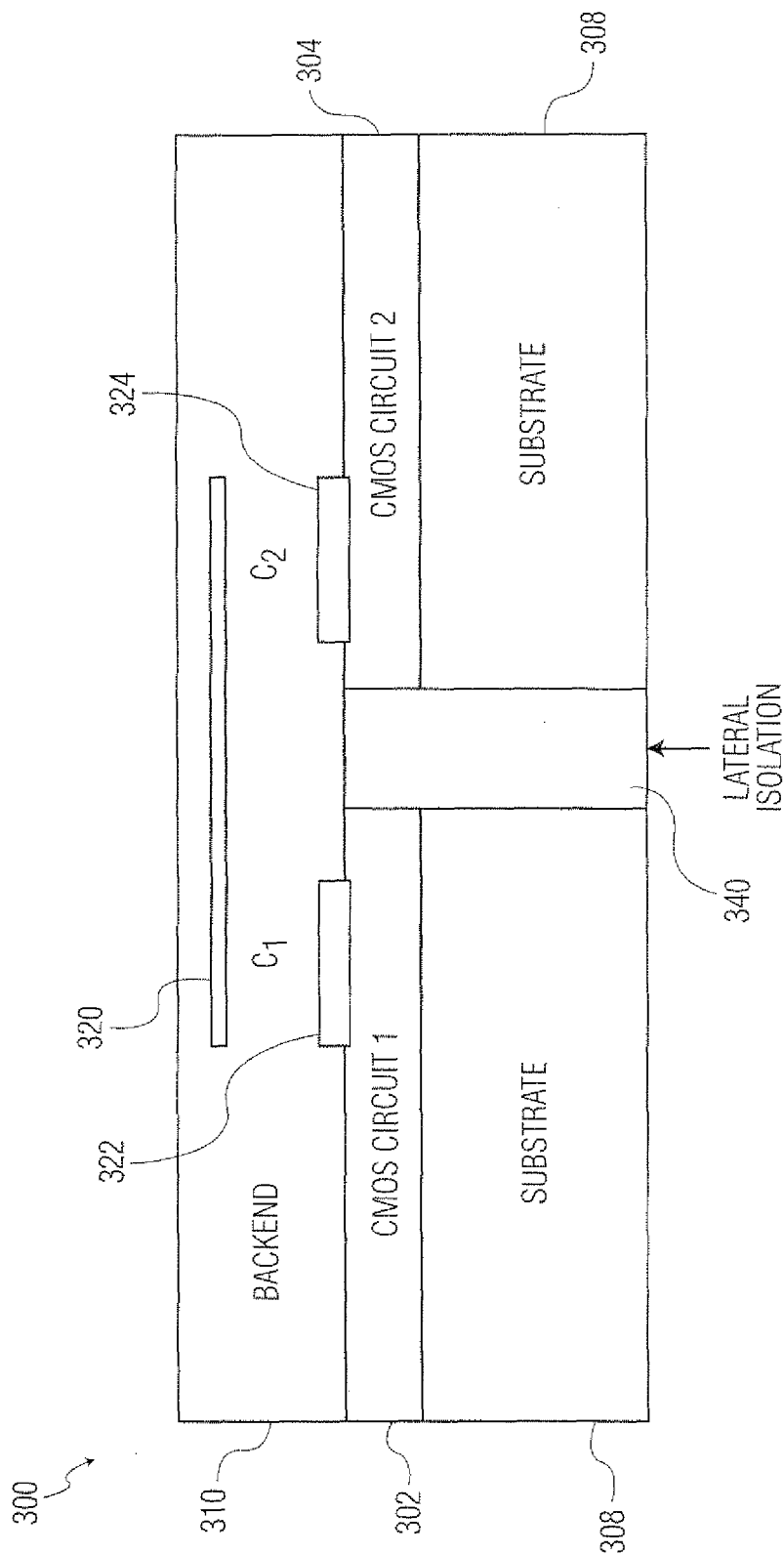
FIG. 3 illustrates a cross-sectional view of another embodiment of a voltage isolated circuit.

FIG. 3 illustrates a cross-sectional view of another embodiment of a voltage isolated circuit. The circuit 300 may include sub-circuits 302, 304. The sub-circuits 302, 304 may be power transistors, isolated CMOS integrated circuits (ICs), or any other sub-circuit needing isolation. The circuit 300 may also include backend 310 that may include conductive interconnect layers as well as insulating layers. The sub-circuits 302, 304 may be connected to one another by the capacitors $C_1$ and $C_2$ that are formed by conductive layers 320, 322, 324. The capacitor may be formed by the conductive layer 322 and one end of the conductive layer 320. The capacitor $C_2$ may be formed by the conductive layer 324 and the other end of the conductive layer 320. The conductive layer 322 may connect the capacitors $C_1$ to $C_2$ to one another. Such a capacitive connection provides electrical isolation between the sub-circuits 302, 304, while allowing certain desired signals to be transmitted between them via the capacitive connection. Finally, lateral insulator 340 may provide insulation between the sub-circuits 302, 304. The lateral insulator 340 may have a width and material sufficient to provide a desired voltage isolation between the sub-circuits 302, 304 and will be further described below. While capacitive isolation is described above, other sorts of isolation may be used as well, for example, optical, acoustic, or inductive.

Figure 4A:
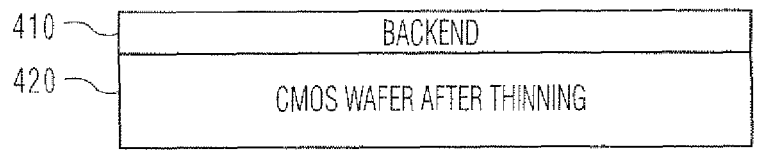
FIGS. 4(a)-(f) illustrate a method of manufacturing integrated power transistors that are separated by through-wafer trench isolation according to a first embodiment.
Figure 4B:
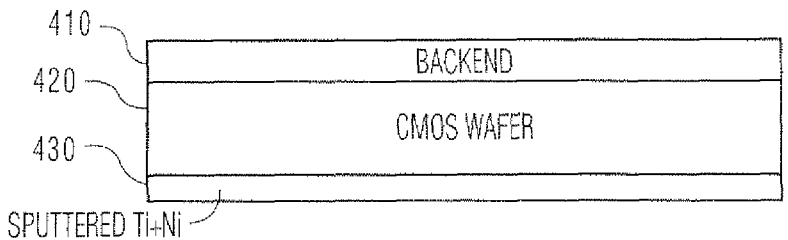
Figure 4C:
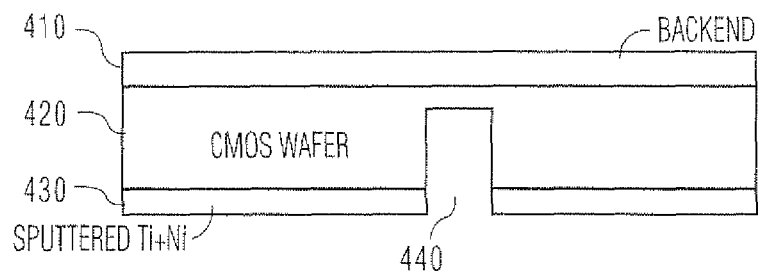
Figure 4D:
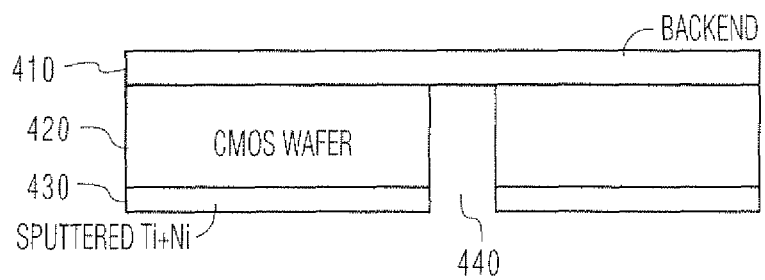

FIGS. 4(a)-(f) illustrate a method of manufacturing integrated transistors that are separated by through-wafer trench isolation according to a first embodiment. FIG. 4(a) illustrates a CMOS wafer 420 after thinning with a backend 410 formed on the CMOS wafer 420. The CMOS wafer 420 along with the backend 410 may include multiple integrated power transistors that may need to be laterally isolated from one another. In FIG. 4(b), the CMOS wafer 420 may be cleaned and then a metallic layer 430 may be formed on the CMOS wafer to act as an etch resist layer. By way of non-limiting example, metallic layer 430 may be formed by sputtering a Ti adhesion layer followed by a Ni barrier layer. Other materials may be used as well as long as they are compatible with the etching process used to etch the trench 440. In FIG. 4(c), the first part of a trench 440 may be formed. The first part of the trench 440 may be formed by sawing or laser dicing. Other methods may be used as well that allow for the quick removal of a significant portion of the CMOS layer to form the first part of the trench 440, e.g., etching. In FIG. 4(d) the rest of the trench 440 may be formed by etching the remaining CMOS wafer 420 to selectively stop at the backend layer 410, which may include an oxide. The etching may be accomplished using various etching methods based upon the materials used, e.g., reactive ion etching (RIE), plasma etching, wet etching, or dry etching.

Figure 4E:
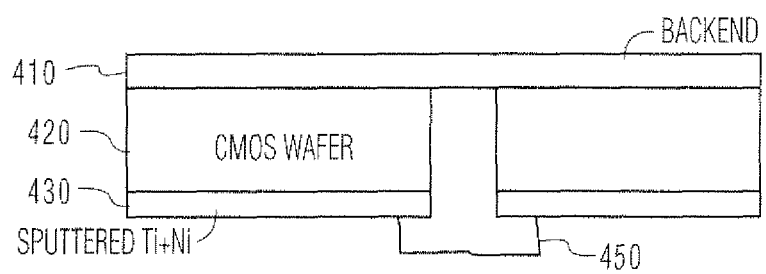
Figure 4F:
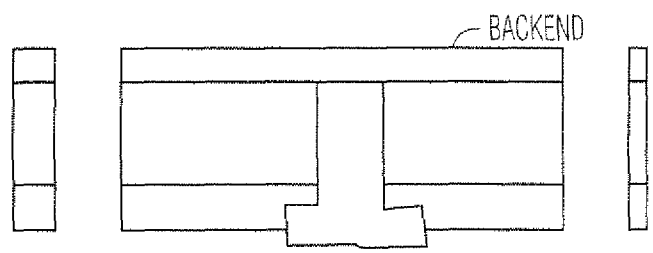
Figure 5A:
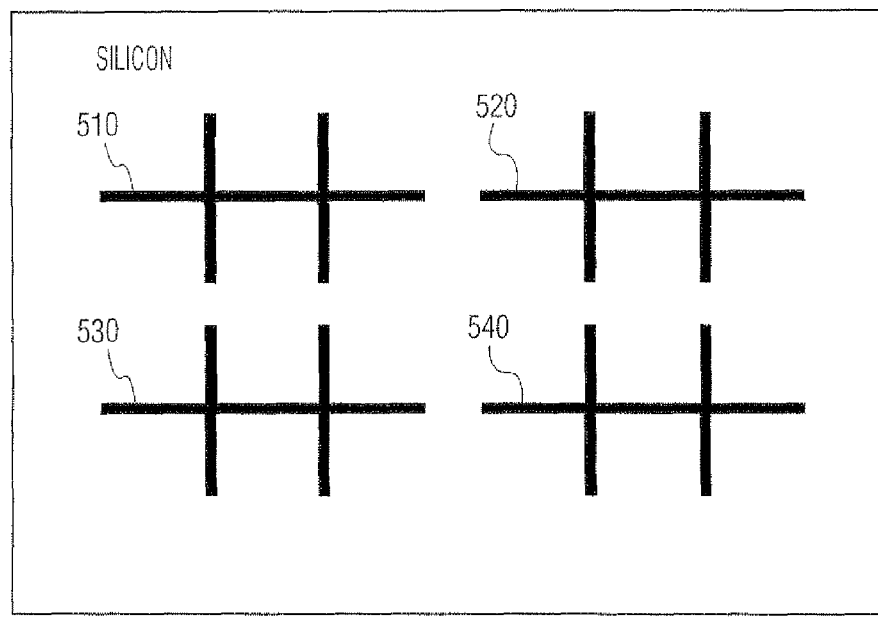
FIGS. 5(a)-(b) illustrates a plan view of the CMOS wafer 500 with the isolation trenches formed before and after dicing.
Figure 5B:
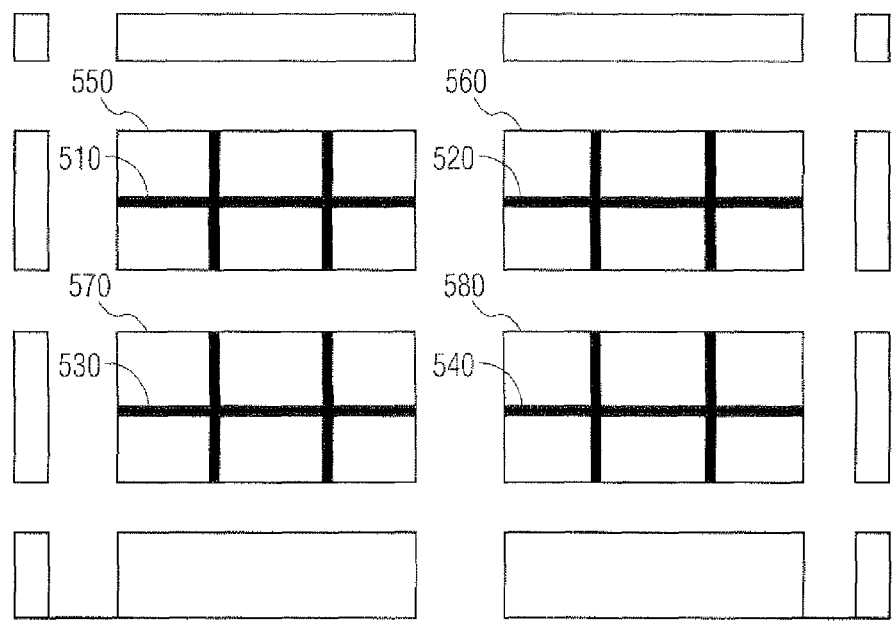

In FIG. 4(e), the lateral insulating layer 450 may be formed. An insulating layer 450 may be formed on the metallic layer and in the trench, for example using spin coating. Next, a photoresist material may be formed on the insulating layer 450. The photoresist may be illuminated and then removed, leaving photoresist in the area over the trench 440. The exposed insulating layer is then etched leaving insulating material in the trench to form a lateral insulating layer 450. The remaining photoresist may then be removed. In FIG. 4(f), a further metallic layer may be formed on the first metallic layer. Such a metallic layer may provide for improved grounding as well as for providing thermal contacts. The resulting structure is then diced and the resulting excess portions are discarded FIG. 5(a) illustrates a plan view of the CMOS wafer 500 with the isolation trenches formed. In FIG. 5(a) four different isolation trench patterns 510, 520, 530, 540 are shown. Each of the isolation trench patterns 510, 520, 530, 540 may provide lateral isolation to six different areas of the CMOS wafer 500. For example, some of the six areas may include an integrated power transistor, and some include low voltage CMOS transistors. As shown in FIG. 5(b), the CMOS wafer 500 may then be diced to form four different CMOS chips 550, 560, 570, 580. The CMOS wafer 500 may be diced so that the isolation trench patterns 510, 520, 530, 540 may extend to the edges of the CMOS chips 550, 560, 570, 580.

Dicing of the CMOS wafer 500 may be accomplished using any known methods, for example, sawing or laser dicing. While a fishbone pattern for the isolation trenches are shown, any other pattern may be used that provides the desired isolation between the various CMOS chips. Further, the pattern of the isolation trenches may also be provided so as to provide the needed structural integrity for the substrate during the manufacturing process.

The embodiment described in FIGS. 4(a)-(f) and 5(a)-(b) has the following possible advantages. A standard CMOS process flow may be followed up to the step shown in FIG. 4(a). As a last step, the through-wafer trenches may be completed according to steps shown in FIGS. 4(b-e) Final dies are made using step 5(b). Further, the requirements for the through-wafer trenches may be less stringent as they may not be affected or modified during the etching, implantation or deposition steps.

Figure 6A:
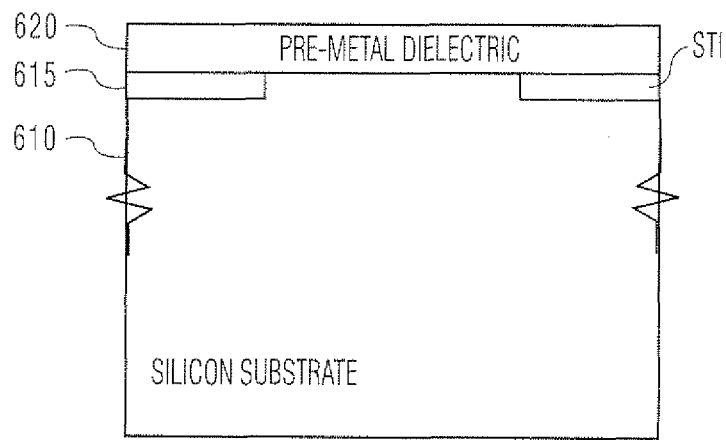
FIGS. 6(a)-(i) illustrate a method of manufacturing integrated power transistors that are separated by through-wafer trench isolation according to a second embodiment.
Figure 6B:
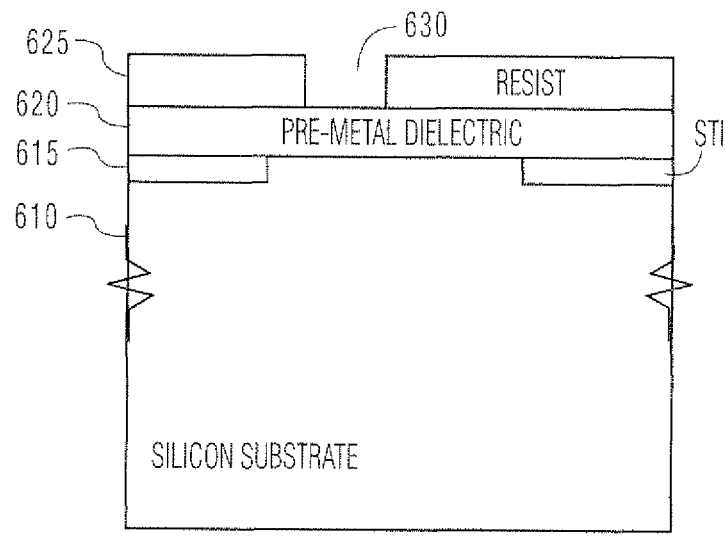
Figure 6C:
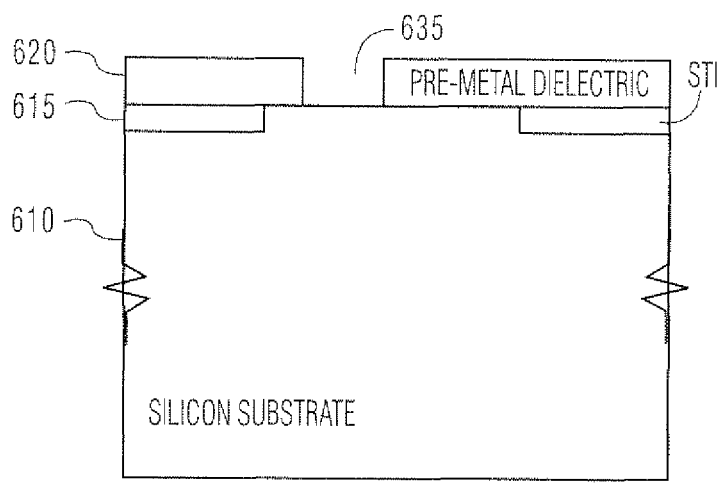

FIGS. 6(a)-(i) illustrate a method of manufacturing integrated circuits that are separated by through-wafer trench isolation according to a second embodiment. In FIG. 6(a), semiconductor devices 615, for example, integrated transistors, may be formed on a silicon substrate 610. A pre-metal dielectric layer 620 may be formed on the silicon substrate 610 and the semiconductor devices 615. The pre-metal dielectric layer 620 may be a typical dielectric layer used between a semiconductor layer and interconnect metal layers. In FIG. 6(b), a photoresist layer 625 may be formed on the pre-metallic dielectric layer 625, and a hole 630 may be formed in the photoresist layer 625. In FIG. 6(c), a hole 635 may be etched in the pre-metallic dielectric layer 620 using the photoresist layer 625, and then the photoresist layer may be removed.

Figure 6D:
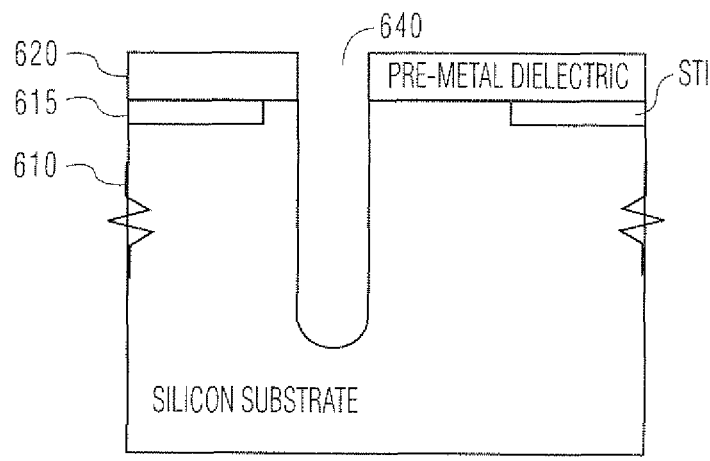
Figure 6E:
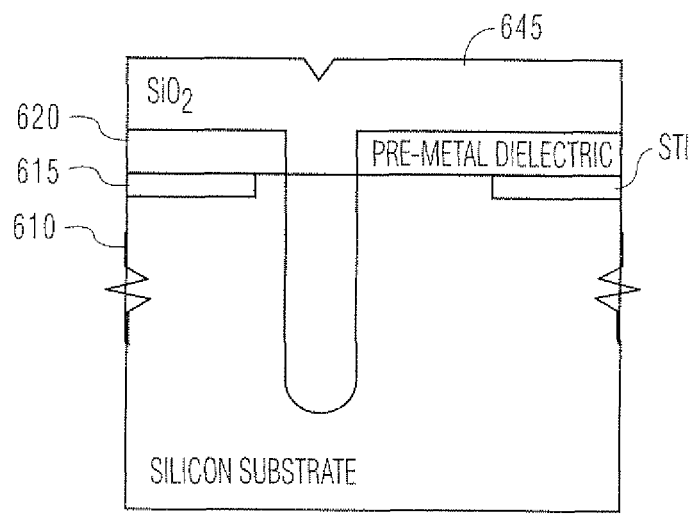
Figure 6F:
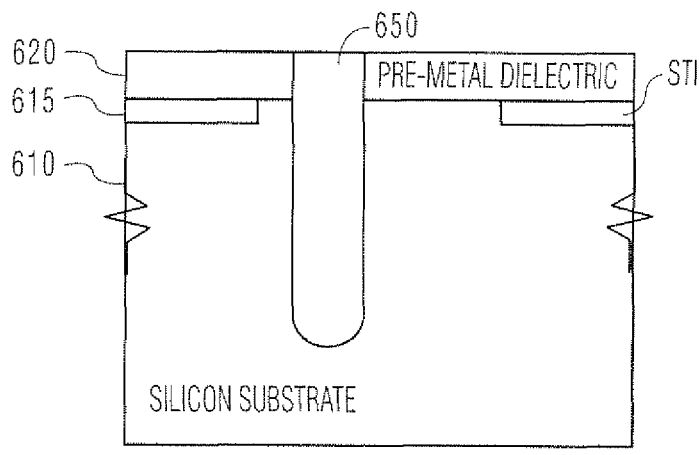

In FIG. 6(d), a trench 640 may be etched through hole 635. The trench 640 may be etched using a silicon dry etching for example through. Other known silicon etching methods may be used as well. In FIG. 6(e), a dielectric layer 645 may be deposited, filling the trench 640 and covering at least a portion of the pre-metal dielectric 620. In FIG. 6(f), some of the dielectric layer 645 may be removed down to the pre-metallic dielectric layer 620 leaving a lateral isolating layer 650 in the trench 640. The dielectric layer material may be chosen to be compatible with further processing that may be performed. The dielectric layer may be removed by etching or chemical-mechanical planarization (CMP) or other known methods.

Figure 6G:
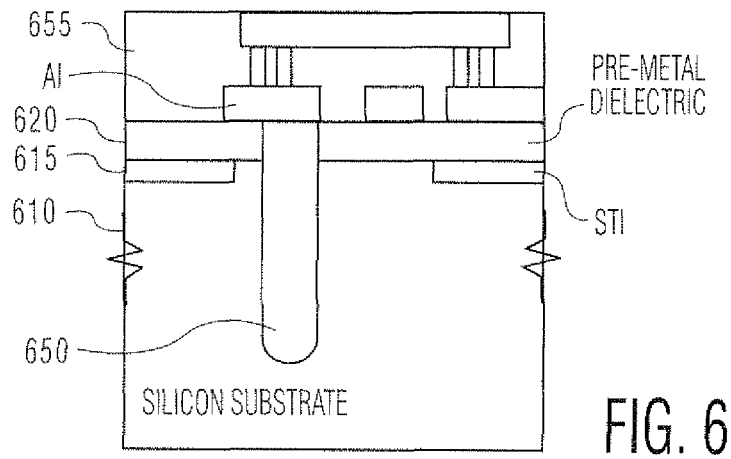
Figure 6H:
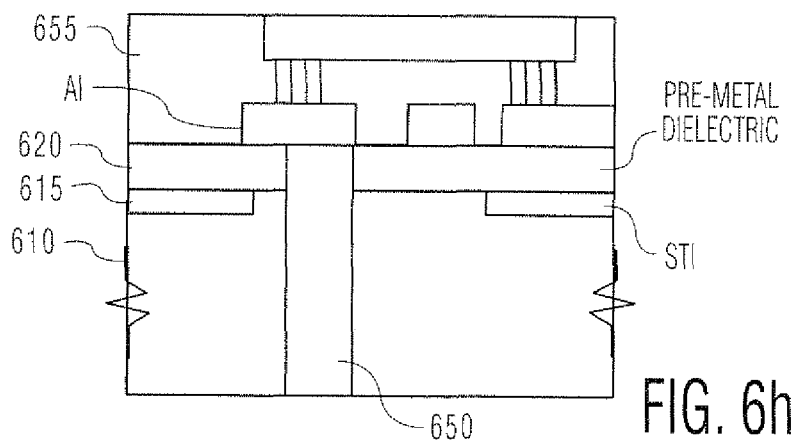
Figure 6I:
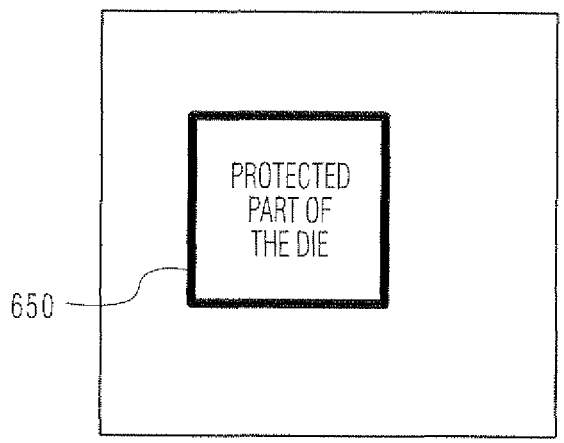

In FIG. 6(g), a standard backend end of line process may be used to form the backend 655. In FIG. 6(h), standard wafer thinning techniques may be used to finalize the isolator structure by removing enough of the silicon substrate 610 to reach the lateral isolating layer 650. Polishing or grinding may be used to reduce the wafer. FIG. 6(i) illustrates a plan view of the CMOS wafer 600. Seen from above, the lateral isolating layer 650 has a square shape which encloses a protected part 660 of the CMOS wafer 600. Accordingly, the lateral isolating layer 650 provides lateral isolation of the protected part of the wafer. Again, the square shape is only exemplary, and the lateral isolating layer 650 may have any shape needed to provide the needed isolation.

The insulating materials used in the lateral isolating layers may include a variety of known insulating materials. For example, polymide, epoxies, silicone, oxides, nitrides, polysilicon, etc. may be used as the insulating material. The specific materials may be chosen to achieve the desired voltage isolation level based upon the expected voltage differences. Further, the width of the lateral isolating layer and other geometric factors may drive the choice of insulating materials. Also, insulating materials may be selected based upon physical characteristics (e.g., stress, structural stability, elasticity, and coefficient of thermal expansion) as well as the ease in forming layers with the insulating material.

The embodiment described in FIGS. 6(a)-(i) may have the following advantages. The second embodiment does not require backside alignment. Further, forming and filling the trench may use a process similar to processes used for through-silicon vias, which are becoming more common in CMOS fabs.

The embodiments described above provide lateral isolating layers that are insulating through-wafer trenches in the CMOS wafers that reach completely from top to backside of the chip, thus creating multiple separated and voltage-isolated semiconductor portions in a single chip/die. Such embodiments may allow for the use of current CMOS production processes. Further, digital circuits and power/HV transistors may be separated and insulated from each other and also from standard CMOS logic circuits by the through-wafer trenches. The embodiments described above may eliminate the need for expensive SOI wafers or junction isolation.

The foregoing discussion of this invention in the context of CMOS devices is by way of example only, and not limitation. This invention also can be employed for BiCMOS and bipolar devices or any other semiconductor devices.

The embodiments described above also may provide the following benefits. The embodiments may result in lower cost because of a simpler assembly e.g., use of a single die and use of on-chip interconnects instead of bond-wires. The embodiments may lead to higher reliability of the resulting product due to fewer components and/or bondwires. The embodiments described may lead to smaller size because a single die is used instead of two or more dies, and also there are fewer bondpads. The embodiments may lead to higher performance due to the shorter length of interconnects and less cross-talk and interference from external sources. Also, the embodiments my result in better matching and control over the back-end-interconnects. Finally, the embodiments may result in better cooling of transistors than in SOI based solutions, because they have an oxide layer between transistor and heat sink at the backside.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A method of producing an isolated semiconductor circuit on a semiconductor wafer with through trenches, comprising:
providing a semiconductor wafer having the semiconductor circuit and a backend;
applying an etch resistant layer on a surface of the semiconductor wafer opposite the backend;
forming a trench through the semiconductor wafer to the backend;
and
filling the trench with an isolating material.

2. The method of claim 1, wherein forming a trench includes:
 forming a first portion of the trench through a portion of the semiconductor layer; and
 forming a second portion of the trench through a remainder of the semiconductor layer and extending to the backend.

3. The method of claim 2, wherein the first portion of the trench is formed using one of sawing, laser dicing, and etching.

4. The method of claim 2, wherein the second portion of the trench is formed using etching.

5. The method of claim 1, wherein the etch resistant layer is metal.

6. The method of claim 1, wherein the method uses CMOS processes.

7. The method of claim 1, further comprising dicing the semiconductor wafer to form a plurality of separated semiconductor portions.

8. The method of claim 1, further comprising forming a metallic layer on the etch resistant layer to provide electrical contacts for the semiconductor circuit.

9. The method of claim 1, wherein the trench has a fishbone pattern on the surface of the semiconductor wafer opposite the backend.

10. The method of claim 1, wherein the trench defines at least two separated semiconductor portions, each of the semiconductor portions including part of the semiconductor circuit.

11. A method of producing an isolated semiconductor circuit on a semiconductor wafer with through trenches, comprising:
 providing the semiconductor wafer, the semiconductor wafer having a semiconductor circuit;
 depositing a pre-metallic dielectric layer on the semiconductor wafer;
 producing a trench through the pre-metallic dielectric layer and into the semiconductor wafer;
 filling the trench with a dielectric material;
 producing a backend of the semiconductor circuit; and
 thinning polishing the wafer so that the trench extends completely through the semiconductor layer.

12. The method of claim 11, further comprising dicing the semiconductor wafer to form a plurality of semiconductor portions.

13. The method of claim 11, wherein the method uses CMOS processes.

14. The method of claim 11, wherein the trench defines a fishbone pattern on a surface of the semiconductor wafer opposite the backend.

15. The method of claim 11, wherein the trench defines an island including the semiconductor circuit.

* * * * *